US012772462B2

(12) United States Patent
Oh

(10) Patent No.: US 12,772,462 B2
(45) Date of Patent: Oct. 20, 2026

(54) SEMICONDUCTOR PACKAGE INCLUDING AN ADHESIVE STRUCTURE

(71) Applicant: SAMSUNG ELECTRONICS CO., LTD., Suwon-si (KR)

(72) Inventor: Jooyoung Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 18/344,927

(22) Filed: Jun. 30, 2023

(65) Prior Publication Data

US 2024/0014164 A1 Jan. 11, 2024

(30) Foreign Application Priority Data

Jul. 5, 2022 (KR) ........................ 10-2022-0082616

(51) Int. Cl.
*H10B 80/00* (2026.01)
*H10W 70/65* (2026.01)
(Continued)

(52) U.S. Cl.
CPC ............ *H10B 80/00* (2023.02); *H10W 70/65* (2026.01); *H10W 90/00* (2026.01); (Continued)

(58) Field of Classification Search
CPC ... H01L 24/32; H01L 23/49838; H01L 24/05; H01L 24/06; H01L 24/30; H01L 24/33; (Continued)

(56) References Cited

U.S. PATENT DOCUMENTS 6,541,872 B1 * 4/2003 Schrock .............. H10W 70/415 257/784
7,919,851 B2 4/2011 Fan
(Continued)

FOREIGN PATENT DOCUMENTS

JP 2008-282941 A 11/2008
KR 10-2005-0052658 6/2005
(Continued)

OTHER PUBLICATIONS

Office Action dated Nov. 16, 2025 issued in corresponding to Korean Patent Application No. 10-2022-0082616.
(Continued)

*Primary Examiner* — Fernando L Toledo
*Assistant Examiner* — Shawn Shaw Muslim
(74) *Attorney, Agent, or Firm* — Morgan, Lewis & Bockius LLP

(57) ABSTRACT

A semiconductor package includes a package substrate, where a plurality of bonding pads are arranged on an upper surface of the package substrate; a semiconductor chip mounted on the upper surface of the package substrate, where a plurality of chip pads are arranged on an upper surface of the semiconductor chip; a first adhesive film attached to a lower surface of the semiconductor chip, wherein the first adhesive film having a first area corresponding to an area of the semiconductor chip; a second adhesive film attached to the upper surface of the package substrate, where the second adhesive film is joined to the first adhesive film, and the second adhesive film has a second area larger than the first area; a plurality of bonding wires; and a molding portion disposed on the upper surface of the package substrate.

20 Claims, 6 Drawing Sheets

I1-I1'

(51) Int. Cl.

| | |
|---|---|
| ***H10W 90/00*** | (2026.01) |
| *H10W 72/00* | (2026.01) |
| *H10W 72/30* | (2026.01) |
| *H10W 72/50* | (2026.01) |
| *H10W 72/90* | (2026.01) |
| *H10W 90/24* | (2026.01) |
| *H10W 90/26* | (2026.01) |

(52) U.S. Cl.

CPC .... *H10W 72/073* (2026.01); *H10W 72/07338* (2026.01); *H10W 72/07352* (2026.01); *H10W 72/07354* (2026.01); *H10W 72/321* (2026.01); *H10W 72/327* (2026.01); *H10W 72/347* (2026.01); *H10W 72/5445* (2026.01); *H10W 72/5449* (2026.01); *H10W 72/865* (2026.01); *H10W 72/884* (2026.01); *H10W 72/932* (2026.01); *H10W 72/9445* (2026.01); *H10W 90/24* (2026.01); *H10W 90/26* (2026.01); *H10W 90/732* (2026.01); *H10W 90/734* (2026.01); *H10W 90/752* (2026.01); *H10W 90/754* (2026.01)

(58) Field of Classification Search

CPC ......... H01L 24/48; H01L 24/49; H01L 24/73; H01L 24/83; H01L 25/0652; H01L 25/0657; H01L 25/18; H01L 2224/05553; H01L 2224/06155; H01L 2224/3003; H01L 2224/3201; H01L 2224/32145; H01L 2224/32225; H01L 2224/33181; H01L 2224/48091; H01L 2224/48108; H01L 2224/48147; H01L 2224/48227; H01L 2224/49171; H01L 2224/49175; H01L 2224/73215; H01L 2224/73265; H01L 2224/83193; H01L 2224/83862; H01L 2225/06506; H01L 2225/0651; H01L 2225/06562; H01L 2225/06565; H01L 2924/1431; H01L 2924/1432; H01L 2924/1436; H01L 2924/1437; H01L 2924/1441; H01L 2924/1443; H01L 2924/14511; H01L 24/92; H01L 23/49816; H01L 2224/85; H01L 2224/8385; H01L 2225/06586; H01L 24/31; H01L 23/3107; H01L 23/4824; H01L 24/07; H01L 24/47; H10B 80/00

See application file for complete search history.

(56) References Cited

U.S. PATENT DOCUMENTS

| | | | | |
|---|---|---|---|---|
| 8,394,678 | B2 * | 3/2013 | Murayama .......... | H10W 70/453 257/691 |
| 8,421,197 | B2 | 4/2013 | Do et al. | |
| 9,064,973 | B2 | 6/2015 | Clyne et al. | |
| 10,910,422 | B2 | 2/2021 | Kim | |
| 10,916,508 | B2 | 2/2021 | Takemoto | |
| 2016/0013158 | A1 * | 1/2016 | Kang ................ | H01L 23/49838 257/777 |
| 2021/0035873 | A1 | 2/2021 | Yang | |

FOREIGN PATENT DOCUMENTS

| | | |
|---|---|---|
| KR | 10-2008-0105638 A | 12/2008 |
| KR | 10-2016-0066012 A | 6/2016 |
| KR | 10-2017-0085676 A | 7/2017 |

OTHER PUBLICATIONS

Notice of Allowance dated Apr. 11, 2026 issued in corresponding to Korean Patent Application No. 10-2022-0082616.

* cited by examiner

I3-I3'

SEMICONDUCTOR PACKAGE INCLUDING AN ADHESIVE STRUCTURE

CROSS-REFERENCE TO RELATED APPLICATION(S)

This application claims priority under 35 U.S.C. 119 to Korean Patent Application No. 10-2022-0082616, filed on Jul. 5, 2022, in the Korean Intellectual Property Office, the disclosure of which is herein incorporated by reference in its entirety.

TECHNICAL FIELD

The present disclosure relates to a semiconductor package.

DISCUSSION OF RELATED ART

Recently, in the electronic products market, demand for portable devices has been rapidly increasing, and accordingly, there is a need for miniaturization and weight reduction of electronic components used in portable devices. In order to reduce the size and weight of electronic components, it is also beneficial to improve a degree of integration of semiconductor devices used for electronic components.

SUMMARY

An aspect of the present disclosure provides a semiconductor package having improved reliability in a state of being mounted on a main board.

According to an aspect of the present disclosure, a semiconductor package includes a package substrate, where a plurality of bonding pads are arranged on an upper surface of the package substrate; a semiconductor chip mounted on the upper surface of the package substrate, where a plurality of chip pads are arranged on an upper surface of the semiconductor chip; a first adhesive film attached to a lower surface of the semiconductor chip, wherein the first adhesive film having a first area corresponding to an area of the semiconductor chip; a second adhesive film attached to the upper surface of the package substrate, where the second adhesive film is joined to the first adhesive film, and the second adhesive film has a second area larger than the first area; a plurality of bonding wires respectively connecting the plurality of bonding pads to the plurality of chip pads; and a molding portion disposed on the upper surface of the package substrate.

According to another aspect of the present disclosure, a semiconductor package includes a package substrate, wherein a plurality of bonding pads are arranged on an upper surface of the package substrate; a first semiconductor chip mounted on the upper surface of the package substrate, wherein a plurality of first chip pads are arranged on an upper surface of the first semiconductor chip; a second semiconductor chip mounted on the upper surface of the package substrate, wherein a plurality of second chip pads are arranged on an upper surface of the second semiconductor chip; a first adhesive structure disposed between the package substrate and the first semiconductor chip; a second adhesive structure disposed between the package substrate and the second semiconductor chip; a plurality of bonding wires respectively connecting the plurality of bonding pads and the plurality of first and second chip pads; and a molding portion disposed on the upper surface of the package substrate, the molding portion covering the first and second semiconductor chips and the plurality of bonding wires. The first adhesive structure includes a first adhesive film attached to a lower surface of the first semiconductor chip and a lower surface of the second semiconductor chip. The second adhesive structure includes a second adhesive film disposed on the first adhesive film and attached to the upper surface of the package substrate. An area of the first adhesive film is larger than an area of the second adhesive film.

According to another aspect of the present disclosure, a semiconductor package includes a package substrate, wherein a plurality of bonding pads are arranged on an upper surface of the package substrate; a semiconductor chip mounted on the upper surface of the package substrate, wherein a plurality of chip pads are arranged on an upper surface of the semiconductor chip; a first adhesive film attached to a lower surface of the semiconductor chip, the first adhesive film having an area, corresponding to an area of the semiconductor chip; a second adhesive film attached to the upper surface of the package substrate, wherein the second adhesive film is disposed on the first adhesive film, the second adhesive film having portions respectively extending from edges of the first adhesive film on the upper surface of the package substrate; a plurality of bonding wires respectively connecting the plurality of bonding pads and the plurality of chip pads; and a molding portion disposed on the upper surface of the package substrate, the molding portion covering the semiconductor chip and the plurality of bonding wires.

According to example embodiments of the present disclosure, a two-layer adhesive structure may be introduced to attach a semiconductor chip to an upper surface of a package substrate. In particular, a lower adhesive layer may be expanded to have an area larger than an area of the semiconductor chip and area of an upper adhesive layer, such that stress concentrated in a vertical direction of a boundary of the semiconductor chip may be dispersed through the lower adhesive layer, thereby alleviating thermal shock.

BRIEF DESCRIPTION OF DRAWINGS

The above and other aspects, features, and advantages of the present inventive concept will be understood from the following detailed description, taken in conjunction with the accompanying drawings, in which.

DETAILED DESCRIPTION

Hereinafter, various example embodiments of the present disclosure will be described in detail with reference to the accompanying drawings.

Figure 1:
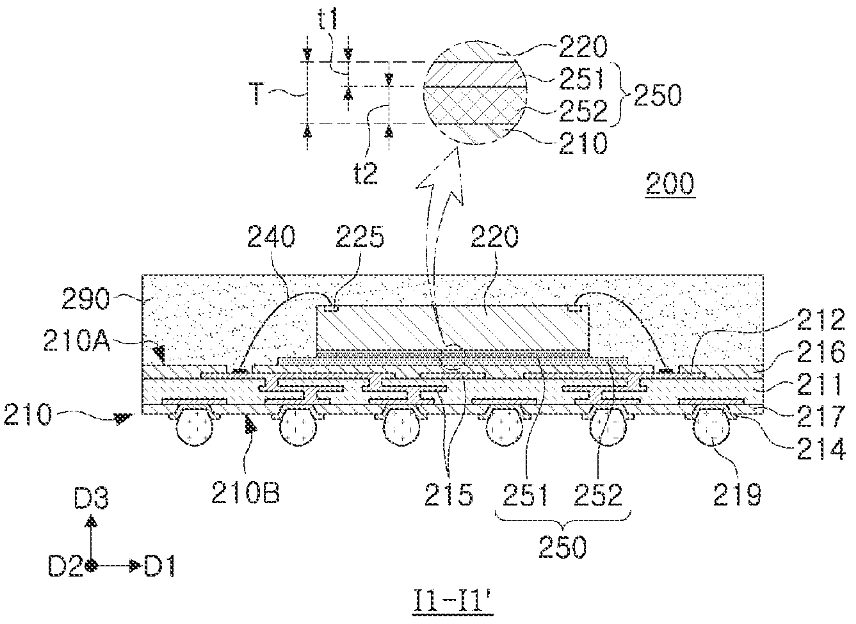
FIG. 1 is a side cross-sectional view illustrating a semiconductor package according to an example embodiment of the present disclosure.
Figure 2:
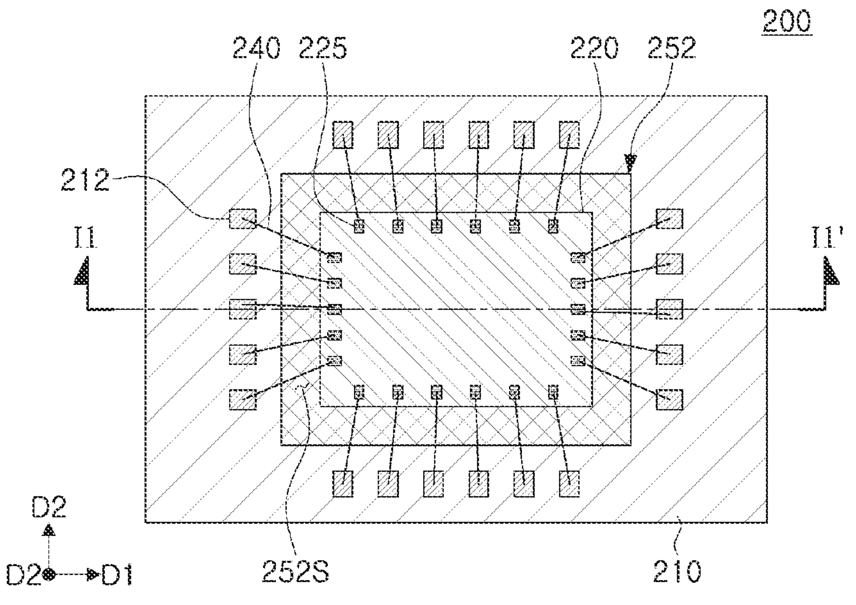
FIG. 2 is a plan view illustrating the semiconductor package illustrated in FIG. 1.

FIG. 1 is a cross-sectional side view illustrating a semiconductor package according to an example embodiment of the present disclosure, and FIG. 2 is a plan view illustrating the semiconductor package illustrated in FIG. 1. FIG. 1 may refer to a semiconductor taken along line I1-I1' as illustrated in FIG. 2.

Referring to FIGS. 1 and 2, a semiconductor package 200 according to an example embodiment of the present disclosure may include a package substrate 210 and a semiconductor chip 220 mounted on the package substrate 210. The package substrate 210 may include a substrate body 211 and a wiring circuit 215. In some cases, a plurality of insulating layers are stacked on the substrate body 211. In some cases, the wiring circuit 215 forms conductive vertical interconnect accesses (vias) on an upper surface 210A of the substrate body 211 and conductive patterns in the insulating layers. Vias are openings that are used to connect different layers of a semiconductor device. In some examples, the conductive patterns have similar shapes. In some examples, the conductive patterns have different shapes. The package substrate 210 may include a plurality of bonding pads 212 disposed on the upper surface 210A of the substrate body 211 and a plurality of external connection pads 214 disposed on a lower surface 210B of the substrate body 211. The wiring circuit 215 may electrically connect the plurality of bonding pads 212 and the plurality of external connection pads 214 to each other. But the present disclosure might not be necessarily limited thereto, and according to some embodiments, one or more of the plurality of external connection pads 214 are not electrically connected to a bonding pad.

In some example embodiments, the substrate body 211 may include a an insulating layer made of a resin such as an epoxy resin, a bakelite resin, a paper epoxy, or a glass epoxy. The wiring circuit 215 may be formed of gold (Au), silver (Ag), platinum (Pt), aluminum (Al), copper (Cu), or the like. For example, the package substrate 210 may include a printed circuit board (PCB). In one example embodiment, the package substrate 210 may be a redistribution substrate having a circuit pattern. The substrate body 211 may include an inorganic insulating layer that is made of a material such as silicon oxide, silicon nitride, or a photosensitive organic insulating material such as a photo imageable dielectric (PID).

In some example embodiments, the package substrate 210 may include first and second solder resist layers 216 and 217 respectively disposed on the upper surface 210A and the lower surface 210B. The first solder resist layer 216 may have a plurality of openings. In some cases, the plurality of bonding pads 212 are disposed in the plurality of openings and at least some of the plurality of openings are occupied by a portion of the bonding pads. Similarly, the second solder resist layer 217 may have a plurality of openings for disposing the plurality of external connection pads 214, The semiconductor chip 220 may be mounted on the upper surface 210A of the package substrate 210. In some cases, a plurality of chip pads 225 are arranged on an upper surface of the semiconductor chip 220. A chip pad 225 arranged on the semiconductor chip 220 may be electrically connected to the bonding pad 212 of the package substrate 210 via a bonding wire 240.

The semiconductor chip 220 may include, for example, silicon (Si), but the present disclosure might not be necessarily limited thereto. The semiconductor chip 220 may include a semiconductor element such as germanium (Ge) or a compound semiconductor such as silicon carbide (SiC), gallium arsenide (GaAs), indium arsenide (InAs), and indium phosphide (InP). In some example embodiments, the semiconductor chip 220 may have a silicon on insulator (SOI) structure. A SOI structure is a thin layer of silicon that is bonded onto an insulating substrate, such as silicon dioxide or sapphire. In some cases, an active region, for example, a well doped with an impurity or a structure doped with an impurity, may be formed on the upper surface (accordingly, also referred to as an "active surface") of the semiconductor chip 220. The active region may refer to an isolation structure such as a shallow trench isolation (STI) structure.

The semiconductor chip 220 may be attached to the upper surface 210A of the package substrate 210 by an adhesive structure 250. According to an example embodiment of the present disclosure, the adhesive structure 250 has a two-layer structure and may include adhesive layers 251 and 252.

Referring to FIG. 1, the adhesive structure 250 may include a first adhesive film 251 attached to a lower surface of the semiconductor chip 220, and a second adhesive film 252 attached to an upper surface of the package substrate 210. In some examples, an upper surface of the second adhesive film 252 is disposed on a lower surface of the first adhesive film and to be joined to the lower surface of the first adhesive film. In an example embodiment of the present disclosure, the first adhesive film 251 may have a first area corresponding to an area of the semiconductor chip 220, and the second adhesive film 252 may have a second area, larger than the first area.

In one aspect, as illustrated in FIG. 2, the second adhesive film 252 may have portions 252S respectively extending from four edges of the semiconductor chip 220 along the upper surface 210A of the package substrate 210.

The second adhesive film 252 may be expanded along the upper surface 210A of the package substrate 210 to form an area larger than an area of the upper surface or the lower surface of the semiconductor chip 220 and an area of an upper surface or a lower surface of the first adhesive film 251. In some cases, the upper and lower surfaces of the semiconductor 220 and the upper and lower surfaces of the first adhesive layer have substantially the same size of area. According to some embodiments, stress applied to the semiconductor chip 220 (for example, due to a thermal shock) in a vertical direction (for example, D3) may be dispersed in horizontal directions (for example, D1 and D2) through the extending portion 252S of the second adhesive layer 252.

As described above, the upper surface and the lower surface of the second adhesive film 252 having an area larger than the area of the upper surface and the lower surface of the semiconductor chip 220 may alleviate thermal shock generated in a state in which the semiconductor package 200 is mounted on a main board.

For example, the area of the upper surface and the lower surface of the second adhesive film 252 may be larger than the area of the upper surface and the lower surface of the semiconductor chip 220 (or the area of the first adhesive film 251) by 20% or more. In some example embodiments, the area of the upper surface and the lower surface the second adhesive film 252 may be larger than the area of the upper surface and the lower surface the semiconductor chip 220 by 50% or more.

In addition, the second adhesive film 252 may be disposed between the first adhesive film 251 and the package substrate 210 to increase an overall thickness of the adhesive structure 250, thereby alleviating thermal shock caused by, for example, an increase in thickness of the semiconductor chip 220. A thickness t2 of the second adhesive film 252 may be increased while maintaining the package structure substantially unchanged. For example, the package structure is substantially unchanged when the bonding wire 240 does not protrude from an upper surface of a molding portion 290. However, the present disclosure might not be necessarily limited thereto, and the thickness t2 may be in a range during which the package structure is substantially unchanged.

For example, the thickness t2 of the second adhesive film 252 may be in a range of 10 to 100 μm. A thickness t1 of the first adhesive film 251 may be in a range of 5 to 50 μm. In addition, a sum T of the thicknesses of the first and second adhesive films 251 and 252 may be 30 μm or more. In some example embodiments, the sum T of the thicknesses of the first and second adhesive films 251 and 252 may be 150 μm or less.

The thickness t2 of the upper surface and the lower surface of the second adhesive film 252 may be the same as or different from the thickness t1 of the upper surface and the lower surface of the first adhesive film 251. In some example embodiments, the thickness t2 of the upper surface and the lower surface of the second adhesive film 252 may be greater than the upper surface and the lower surface of the thickness t1 of the first adhesive film 251.

Example experiment results indicate embodiments of the present disclosure increase thermal shock reliability. In one example experiment, the reliability of a semiconductor package mounted on a main board against thermal shock was evaluated under different conditions (as shown in Tests 1 and 2) in which a thickness of a semiconductor chip and a total thickness of an adhesive structure are changed in a semiconductor package as follows.

First, the occurrence of a defect was demonstrated under a thermal shock occurrence condition of repeating a temperature change (within 5 minutes) several times in a range of −40° C. to 85° C. Whether or not a defect occurs was determined by whether or not a crack occurs in an external connection conductor ("219" in FIG. 1) such as a solder ball connected to the main board.

When the thickness of the semiconductor chip and the total thickness of the adhesive structure were 170 μm and 20 μm, respectively (Test 1), as indicated in Table 1 below, a first defective semiconductor package was demonstrated in 285 thermal shocks, and, a defect occurred in a significant number of semiconductor packages in 385 thermal shocks.

TABLE 1

| | The number of times of repeated thermal shocks | | | | | |
|---|---|---|---|---|---|---|
| | 285 | 385 | 497 | 597 | 777 | 882 |
| The number of defects | 1 | 14 | 7 | 0 | 1 | 2 |

When the thickness of the semiconductor chip and the total thickness of the adhesive structure were 200 μm and 40 μm, respectively (Test 2), as indicated in Table 2 below, a defective semiconductor package did not occur even in 389 thermal shocks, while a defect occurred in the semiconductor package in 532 thermal shocks. As described above, it was demonstrated that, in the present test, reliability against thermal shock may be increased only by increasing the thickness of the adhesive structure, despite the condition that the thickness of the semiconductor chip is increased and the thermal shock reliability is lowered, as compared to a previous test condition.

TABLE 2

| | The number of times of repeated thermal shocks | | | | | |
|---|---|---|---|---|---|---|
| | 280 | 389 | 532 | 1034 | 1256 | 280 |
| The number of defects | 0 | 0 | 13 | 7 | 4 | 0 |

As described, it was demonstrated that the thermal shock reliability was increased by an increase in the total thickness of the adhesive structure caused by addition of a second adhesive film.

Considering the test conditions described above, it was demonstrated that the thermal shock reliability increase effect was indicated under the condition that a sum of thicknesses of first and second adhesive films was 20% or more of the thickness of the semiconductor chip. For example, the sum of the thicknesses of the first and second adhesive films may be 30 μm or more.

In some example embodiments, at least one of the first and second adhesive films 251 and 252 may include a thermosetting resin or an ultraviolet curable resin in the form of a film. For example, at least one of the first and second adhesive films 251 and 252 may include a resin film such as a die attach film (DAF). The DAF, for example, may be made of a thermosetting resin, which hardens when exposed to heat, or an ultraviolet curable resin, which hardens when exposed to UV light. In some example embodiments, the second adhesive film 252 may include a material the same as that of the first adhesive film 251. The present disclosure might not be necessarily limited thereto, and the first and second adhesive films 251 and 252 may include different materials.

The semiconductor chip 220 may include a system large scale integration (LSI), flash memory, dynamic random access memory (DRAM), static random access memory (SRAM), EEPROM, phase-change random access memory (PRAM), magnetoresistive random access memory (MRAM), or resistive random access memory (RRAM). Specifically, the semiconductor chip 220 may include various individual devices formed in an active region. The individual device may include, for example, a metal-oxide-semiconductor field effect transistor (MOSFET) such as a complementary metal-insulator-semiconductor transistor (CMOS), a passive device, and the like. The semiconductor chip 220 may include a wiring structure layer electrically connected to the plurality of individual devices. The wiring structure layer may include an insulating layer and a metal wiring layer formed on the insulating layer. A chip pad 225 may be formed on a partial region of the metal wiring layer.

The plurality of external connection conductors 219 may be respectively disposed on the plurality of external connection pads 214. The semiconductor package 200 may be electrically connected to an external system by the plurality of external connection conductors 219. The plurality of external connection conductors 219 may have a shape obtainable through a reflow process, for example, a spherical shape or a substantially spherical shape (for example, an elliptical sphere). Depending on a type of the plurality of external connection conductors 219, the semiconductor package 200 may be in the form of a ball grid array (BGA), a fine ball-grid array (FBGA), or a land grid array (LGA).

The plurality of external connection pads 214 may be electrically connected to a lowermost wiring circuit 215. In one example embodiment, the plurality of external connection pads 214 are in direct contact with a lowermost wiring circuit 215. For example, the plurality of external connection pads 214 may include under bump metallurgy (UBM). Each of the plurality of external connection conductors 219 may include a eutectic metal such as a solder ball. For example, the solder ball may include at least one of tin (Sn), lead (Pb), nickel (Ni), gold (Au), silver (Ag), copper (Cu), bismuth (Bi), and any combination thereof, and may be formed by using a soldering device.

A mold portion 290 may be formed on an upper surface 201A of a package substrate 210. The mold portion 290 may be formed on the upper surface 210A of the p substrate 210 to surround the semiconductor chip 220 and the bonding wire 240. A mold layer 150 may be formed of resin. The mold portion 290 may include, for example, an epoxy mold compound (EMC).

In the semiconductor package 200 according to an example embodiment of the present disclosure, the second adhesive film 252 may be disposed to an upper surface region of the package substrate 210 to which the first adhesive film 251 is to be attached, and the second adhesive film 252 may be expanded to have an area larger than an area of the semiconductor chip 220, such that stress concentrated in a vertical downward direction at a boundary of the semiconductor chip 220 may be dispersed through the expanded portion of the second adhesive film 252. In addition, an overall thickness of the adhesive structure 250 may be increased to correspond to a thickness of the second adhesive film 252, thereby alleviating thermal shock.

Figure 3:
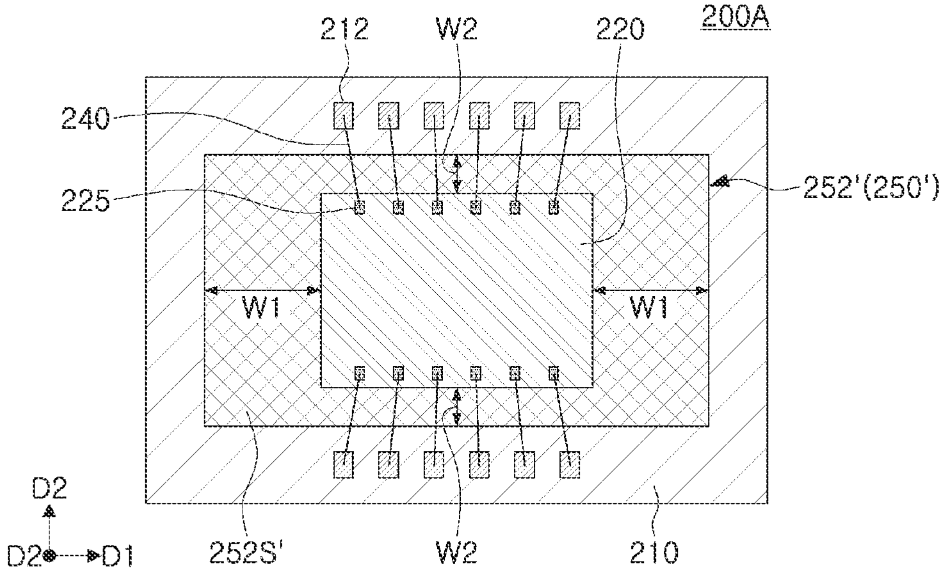
FIG. 3 is a plan view illustrating a semiconductor package according to an example embodiment of the present disclosure.

FIG. 3 is a plan view illustrating a semiconductor package according to an example embodiment of the present disclosure.

Referring to FIG. 3, it may be understood that a semiconductor package 200A according to an example embodiment of the present disclosure has a structure similar to that of the semiconductor package 200 illustrated FIGS. 1 and 2, except that there is a difference therebetween in terms of arrangements of the bonding pads 212 and the chip pads 225, and a form of the extending second adhesive film 252'. Accordingly, the description of the semiconductor package 200 illustrated in FIGS. 1 and 2 may be combined with the description of the semiconductor package 200 according to an example embodiment of the present disclosure, unless otherwise specified.

A adhesive structure 250' employed in the an example embodiment of the present disclosure may include a first adhesive film attached to a lower surface of the semiconductor chip 220, and a second adhesive film 252' attached to an upper surface of the package substrate 210. The second adhesive film 252' is disposed on the first adhesive film.

In a similar manner to the previous example embodiment, the first adhesive film may have an area corresponding to an area of the semiconductor chip 220, and the second adhesive film 252' may have an area larger than an area of the first adhesive film. In other words, the second adhesive film 252' may have portions 252S" respectively extending from four edges of the semiconductor chip 220 on the upper surface of the package substrate 210. In an example embodiment of the present disclosure, the portions extending from the four edges may extend to have different widths.

As illustrated in FIG. 3, portions extending from a first pair of edges opposing each other in a first direction D1 of the semiconductor chip may have a first width W1, and portions extending from a second pair of edges opposing each other in a second direction D2 may have a second width W2. In some cases, the second width W2 is narrower than the first width W1.

The widths W1 and W2 of the extending portions may be adjusted by an arrangement of the bonding pads 212. As in an example embodiment of the present disclosure, the bonding pads 212 may be arranged in a pair of regions adjacent to the second pair of edges of the semiconductor chip 220 opposing to each other in the second direction D2 and are not arranged in a pair of regions adjacent to the first pair of edges opposing each other in the first direction D1. The portions extending from the first pair of edges in the first direction D1 may be extended to have a width, whereas the portions extending from the other two edges opposing each other in the first direction D1 may be positioned to be spaced apart from the bonding pads 212 by a predetermined distance.

As described above, the respective widths W1 and W2 of the extending portion 252S' of the second adhesive film 252' may be adjusted differently and separately depending on the arrangement of the bonding pads 212.

Figure 4A:
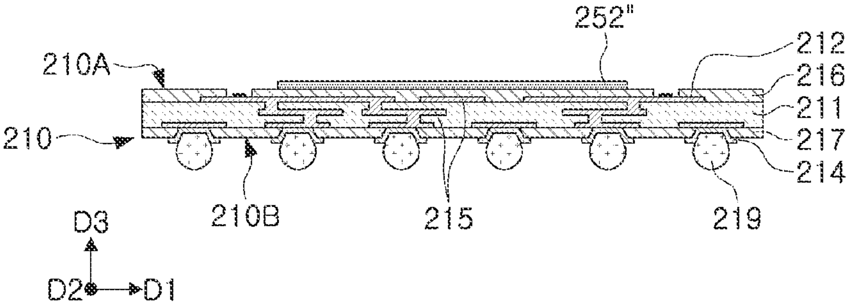
FIGS. 4A and 4B are side cross-sectional views of processes illustrating a semiconductor package manufacturing process (a semiconductor chip joining process)
Figure 4B:
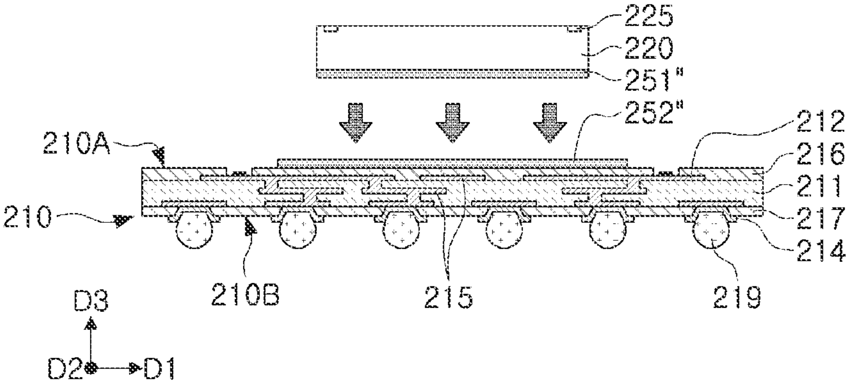

FIGS. 4A and 4B are side cross-sectional views of different processes illustrating a portion of a semiconductor package manufacturing process. The processes of FIGS. 4A and 4B may refer to semiconductor chip joining processes, portions of the semiconductor package manufacturing processes of FIGS. 1 and 2.

Referring to FIG. 4A, a second adhesive film 252" in a semi-cured state (for example, B-stage) may be attached to a partial region of an upper surface 210A of a package substrate 210. A semi-cured state may refer to a stage in a curing process where the adhesive has reached a level of strength or hardness less than that of its final cured state. The second adhesive film 252" may be formed to have an area larger than a mounting area corresponding to a semiconductor chip 220.

Next, referring to FIG. 4B, a semiconductor chip 220 having a lower surface to which a first adhesive film 251" is attached may be prepared, and the semiconductor chip 220 may be mounted on the package substrate 210 such that the first adhesive film 251" and a second adhesive film 252" oppose each other.

The first adhesive film 251" may be attached to a lower surface of a wafer on a wafer level before being cut into the semiconductor chip 220 in a semi-cured state similar to that of the second adhesive film 252", and may be cut together with the semiconductor chip 220. Accordingly, the first adhesive film 251" may have an area corresponding to that of the semiconductor chip 220. After the first and second adhesive films 251" and 252" are joined to each other, heat may be applied to cure the first and second adhesive films 251" and 252", thereby joining the semiconductor chip 220 to the package substrate 210. Subsequently, the semiconductor package 200 illustrated in FIG. 1 may be manufactured by performing a wire bonding process for connecting a chip pad 225 and a bonding pad 212, and a process of forming a molding portion 290.

Figure 5:
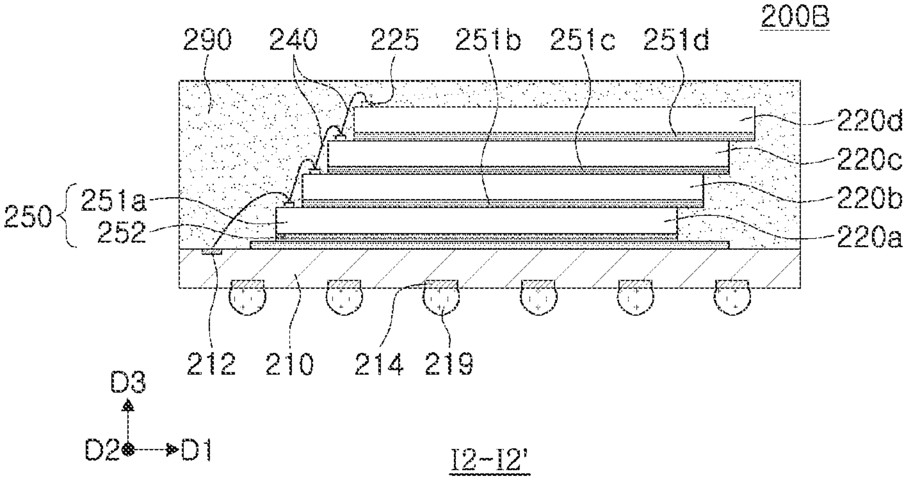
FIG. 5 is a cross-sectional side view illustrating a semiconductor package according to an example embodiment of the present disclosure.
Figure 6:
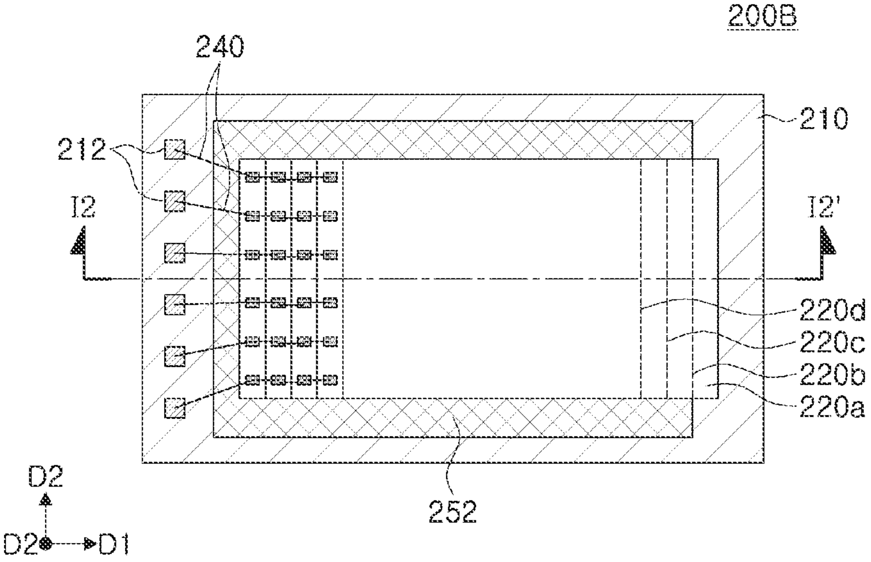
FIG. 6 is a plan view illustrating the semiconductor package illustrated in FIG. 5.

FIG. 5 is a cross-sectional side view illustrating a semiconductor package according to an example embodiment of the present disclosure. FIG. 6 is a plan view illustrating the semiconductor package illustrated in FIG. 5. FIG. 5 may refer to a cross-sectional view of the semiconductor package of FIG. 6 taken along line I2-I2'.

Referring to FIGS. 5 and 6, it may be understood that a semiconductor package 200B according to the an example embodiment of the present disclosure has a structure similar to that of the semiconductor package 200 illustrated FIGS.

1 and 2. Accordingly, the description of the semiconductor package 200 illustrated in FIGS. 1 and 2 may be combined with the description of the semiconductor package 200 according to an example embodiment of the present disclosure, unless otherwise specified.

The semiconductor package 200 may include a package substrate 210, a chip stack, and a molding portion 290 covering the chip stack. A chip stack includes a plurality of semiconductor chips 220*a*, 220*b*, 220*c*, and 220*d* sequentially stacked on the upper surface of the package substrate 210.

As described above, the package substrate 210 may be a printed circuit board (PCB) having a wiring circuit. The package substrate 210 may have a structure in which an insulating film and a wiring layer included in the wiring circuit are alternately stacked. External connection pads 214 connected to the wiring circuit may be disposed on a lower surface of the package substrate 210, and external connection conductors 219 may be respectively disposed on the external connection pads 214. A bonding pad 212 may be included in a partial region of an upper surface of the package substrate 210.

According to some embodiments, the chip stack includes four semiconductor chips 220*a*, 220*b*, 220*c*, and 220*d* stacked in a direction D3, perpendicular to the upper surface of the package substrate 210, but the present disclosure might not be necessarily limited thereto. For example, a chip stack 101 may include a different number (for example, 8 or 16) of semiconductor chips.

In an example embodiment of the present disclosure, first to fourth semiconductor chips 220*a*, 220*b*, 220*c*, and 220*d* may be sequentially stacked on an upper surface of the package substrate 130 to have a structure offset in a first direction D1, with a next chip (for example, 220*b*, 220*c*, and 220*d*) being offset in the first direction D1 by a previous chip (for example, 220*a*, 220*b*, and 220*c*, respectively). For example, the second semiconductor chip 220*b* may be stacked on the lowermost first semiconductor chip 220*a* to be inclined in the first direction D1. For example, the first to fourth semiconductor chips 220*a*, 220*b*, 220*c*, and 220*d* may be in the form of an uphill sloping staircase. The semiconductor chips 220*a*, 220*b*, 220*c*, and 220*d* may form a layered structure, with the package substrate 130 serving as a base and the semiconductor chips forming the layers above the substrate 130.

Exposed upper surface regions of the first to fourth semiconductor chips 220*a*, 220*b*, 220*c*, and 220*d* may be active surfaces. An exposed upper surface region may be a partial region on an upper surface and may not be covered by a semiconductor chip stacked on that upper surface. Chip pads may be disposed on the exposed upper surface regions. For example, chip pads 225 may be disposed on the exposed upper surface regions of the first to fourth semiconductor chips 220*a*, 220*b*, 220*c*, and 220*d*, and may be arranged in a second direction D2 in a region adjacent to edges of the exposed upper surface regions. The first to fourth semiconductor chips 220*a*, 220*b*, 220*c*, and 220*d* may be connected to one another via a bonding wire 240 between adjacent semiconductor chips, and the chip pads 225 of the first semiconductor chip 220 may be connected to bonding pads 212, respectively.

According to some embodiments, in a stacking process, inter-chip adhesive films 252*b*, 252*c*, and 252*d* may be respectively attached to lower surfaces of the second to fourth semiconductor chips 220*b*, 220*c*, and 220*d* to have areas of the same size as that of the respective chip areas.

The first semiconductor chip 220*a* may include a two-layer adhesive structure 252 on the upper surface of the package substrate 210.

Referring to FIG. 5, the adhesive structure 250 may include a first adhesive film 251*a* attached to the lower surface of the first semiconductor chip 220*a*, and a second adhesive film 252 attached to the upper surface of the package substrate 210. The second adhesive film 252 is in direct contact with the first adhesive film 251*a* and accordingly is positioned to be joined to the first adhesive film 251*a*. In an example embodiment of the present disclosure, the first adhesive film 251*a* may have an area corresponding to the area of the first semiconductor chip 220*a*, and the second adhesive film 252 may have an area larger than the area of the first adhesive film 251*a*.

In a similar manner to the previous example embodiments, the second adhesive film 252 may be expanded along an upper surface 210A of the package substrate 210 to have an area larger than an area of the upper surface and the lower surface of the semiconductor chip 220 (or the first adhesive film 251), such that stress concentrated in a vertical direction (for example, D3) at a boundary of the semiconductor chip 220 may be dispersed in horizontal directions (for example, D1 and D2) through an extending portion 252S of the second adhesive layer 252, thereby alleviating thermal shock. For example, the area of the second adhesive film 252 may be larger than the area of the semiconductor chip 220 (or the area of the first adhesive film 251) by 20% or more. In some example embodiments, the area of the second adhesive film 252 may be larger than the area of the semiconductor chip 220 by 50% or more.

In addition, the second adhesive film 252 may be disposed between the first adhesive film 251 and the package substrate 210 to increase a thickness of the adhesive structure 250, thereby alleviating thermal shock caused by an increase in thickness of the semiconductor chip 220*a*. For example, a thickness of the second adhesive film 252 may be in a range of 10 to 100 μm. A sum T of thicknesses of the first and second adhesive films 251 and 252 may be 30 μm or more. In some example embodiments, the thickness of the second adhesive film 252 may be the same as or different from the thickness of the first adhesive film 251.

In some example embodiments, a plurality of stacked semiconductor chips 220*a*, 220*b*, 220*c*, and 220*d* may be the same type of semiconductor chip. For example, the plurality of semiconductor chips may be memory semiconductor chips. The memory chip may be, for example, a volatile memory semiconductor chip such as DRAM or SRAM, or a non-volatile memory semiconductor chip such as PRAM, MRAM, FeRAM, or RRAM. In some example embodiments, the plurality of semiconductor chips may be a flash memory, for example, a NAND flash memory.

In other example embodiments, the plurality of stacked semiconductor chips may include different types of semiconductor chips. For example, some semiconductor chips of the plurality of semiconductor chips may be logic chips, and the other semiconductor chips of the plurality of semiconductors may be memory chips. For example, the logic chip may be a central processing unit (CPU) chip, a graphics processing unit (GPU) chip, or an application processor (AP) chip.

Figure 7:
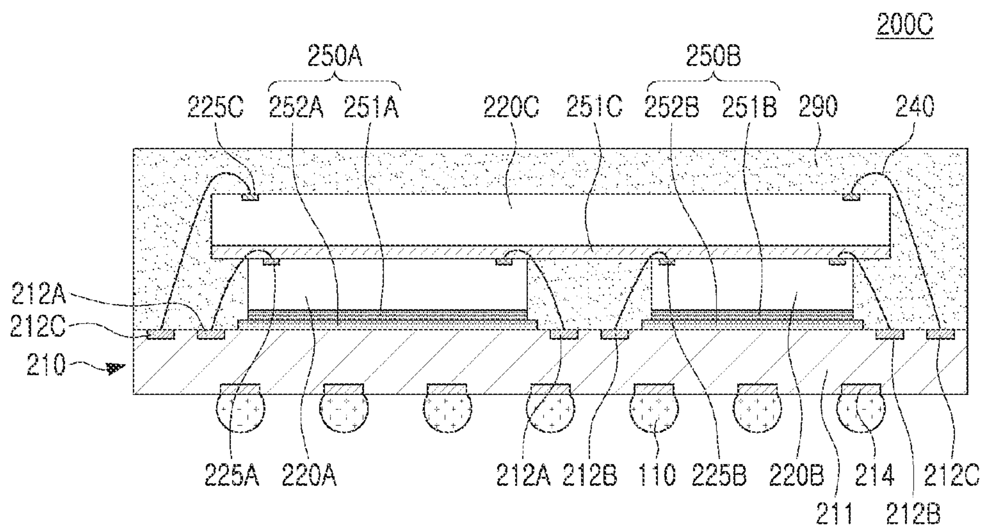
FIG. 7 is a side cross-sectional view illustrating a semiconductor package according to an example embodiment of the present disclosure.
Figure 8:
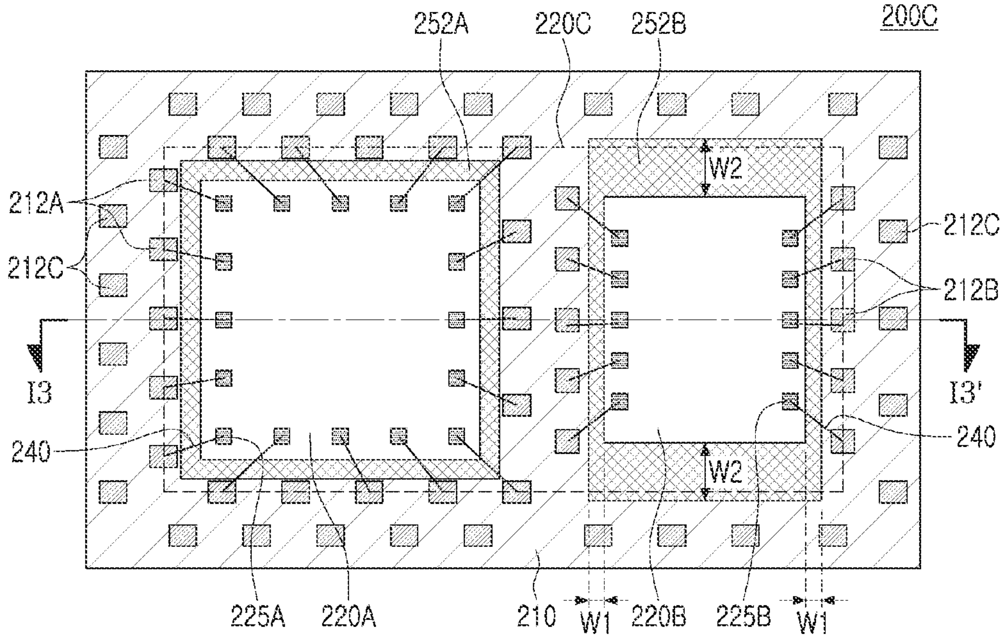
FIG. 8 is a plan view illustrating the semiconductor package illustrated in FIG. 7.

FIG. 7 is a side cross-sectional view illustrating a semiconductor package according to an example embodiment of the present disclosure, and FIG. 8 is a plan view illustrating the semiconductor package illustrated in FIG. 7. FIG. 7 may refer to a cross-sectional view of the semiconductor package of FIG. 8 taken along lines I3-I3'.

Referring to FIGS. 7 and 8, it may be understood that a semiconductor package 200C according to the an example embodiment of the present disclosure has a structure similar to that of the semiconductor package 200 illustrated FIGS. 1 and 2, except that there is a difference therebetween in that a plurality of semiconductor chips 220A, 220B, and 220C, are included, and the upper semiconductor package 200C is disposed on the first and second lower semiconductor chips 220A and 220B. Accordingly, the description of the semiconductor package 200 illustrated in FIGS. 1 and 2 may be combined with the description of the semiconductor package 200 according to an example embodiment of the present disclosure, unless otherwise specified.

The semiconductor package 200C according to an example embodiment of the present disclosure may include a package substrate 210, first and second lower semiconductor chips 220A and 220B disposed on the package substrate 210, and an upper semiconductor chip 220C disposed on the first and second lower semiconductor chips 220A and 220B. In the plane illustrated in FIG. 1, an arrangement of the first and second lower semiconductor chips 220A and 220B is illustrated, and a dotted line indicates the upper semiconductor chip 220C.

The package substrate 210 may include bonding pads 212A, 212B, and 212C disposed on an upper surface thereof, and an external connection pad 214 disposed on a lower surface thereof. In addition, the bonding pads 212A, 212B, and 212C and the external connection pad 214 may be electrically connected to a wiring circuit formed in the package substrate 210. For example, the package substrate 210 may be a printed circuit board (PCB). The package substrate 210 may be a wiring board and might not be necessarily limited to the printed circuit board.

The chip pads 225A and 225B of the first and second lower semiconductor chips 220A and 220B may be electrically connected to first bonding pads 212A and second bonding pads 212B among the bonding pads respectively via a bonding wire 240.

The first and second lower semiconductor chips 220A and 220B may be joined to an upper surface of the package substrate 210 by using first and second adhesive structures 250A and 250B.

A first adhesive structure 250A may include a first adhesive film 251A attached to a lower surface of the first lower semiconductor chip 220A, and a second adhesive film 252A attached to an upper surface of the package substrate 210 to be joined to the first adhesive film 251A. Similarly, the second adhesive structure 250B may include a first adhesive film 251B attached to a lower surface of the second lower semiconductor chip 220B, and a second adhesive film 252B attached to an upper surface of the package substrate 210 to be joined to the first adhesive film 251B.

In an example embodiment of the present disclosure, the first adhesive films 251A and 251B may have areas corresponding to areas of the first and second semiconductor chips 220A and 220B, respectively, and the second adhesive films 252A and 252B may have areas greater than areas of the first adhesive films 251A and 251B, respectively. In some example embodiments, the first adhesive films 251A and 251B may include the same material. In addition, the first adhesive films 251A and 251B may have the same thickness. Similarly, the second adhesive films 252A and 252B may include the same material. In addition, the second adhesive films 252A and 252B may have the same thickness.

As described above, each of a plurality of semiconductor chips may be mounted on an upper surface of a package substrate using a two-layer adhesive structure according to an example embodiment of the present disclosure, thereby alleviating thermal stress concentrated at a boundary between the semiconductor chips.

The upper semiconductor chip 220C may be joined to upper surfaces (for example, active surfaces) of the first and second lower semiconductor chips 220A and 220B by a non-conductive adhesive film 251C. The upper semiconductor chip 220C may be disposed to cover upper surfaces of the first and second lower semiconductor chips 220A and 220B. In some cases, the upper semiconductor chip 220C may be disposed to cover the entire upper surfaces of both the first and second lower semiconductor chips 220A and 220B. Chip pads 225C of the upper semiconductor chip 220C may be connected to third bonding pads 212C among bonding pads by bonding wires 240, respectively.

In some example embodiments, the first and second lower semiconductor chips 220A and 220B may be volatile memory chips and/or non-volatile memory chips. For example, the volatile memory chip may include DRAM, SRAM, TRAM, ZRAM, or TTRAM. In addition, the non-volatile memory chip may be, for example, flash memory, MRAM, STT-MRAM, FRAM, PRAM, RRAM, nanotube RRAM, polymer RAM, nano floating gate memory, holographic memory, molecular electronic memory, or insulation resistance change memory.

In some example embodiments, the upper semiconductor chip 220C may be a processor chip. For example, the upper semiconductor chip 300 may include a microprocessor, a graphic processor, a signal processor, a network processor, a chipset, an audio codec, a video codec, an application processor, or a system on chip, but is not limited thereto. For example, the microprocessor may include a single core or multiple cores.

In some example embodiments, a semiconductor package may further include a dummy chip such as a stiff member or a heat spreader. For example, at least one of the first and second lower semiconductor chips 220A and 220B and the upper semiconductor chip 220C may be replaced with a dummy chip. In some other example embodiments, at least one semiconductor chip may be configured as a chip stack including a plurality of semiconductor chips stacked on the substrate.

Figure 9:
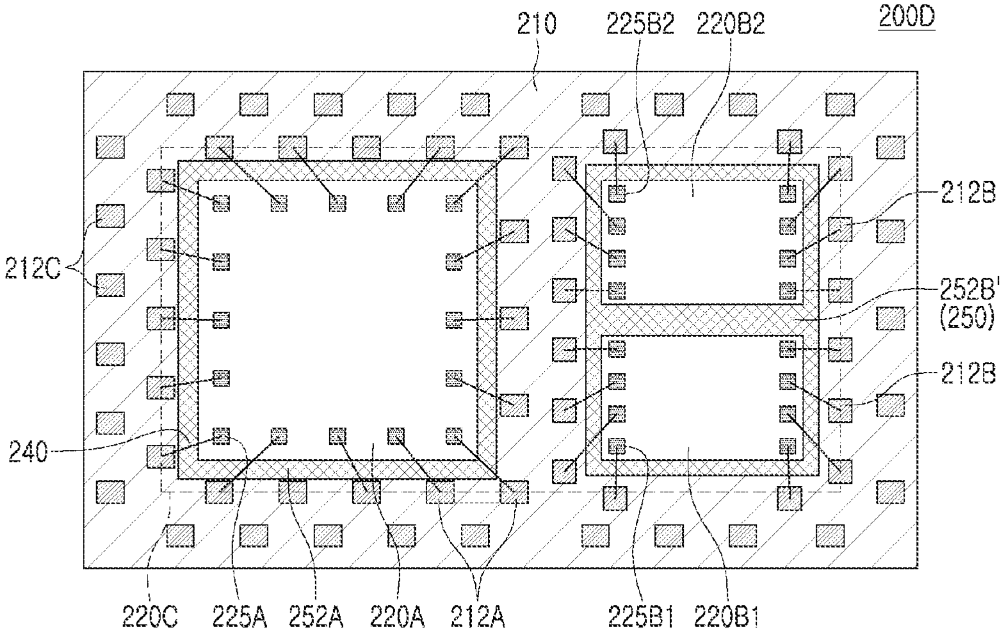
FIG. 9 is a plan view illustrating a semiconductor package according to an example embodiment of the present disclosure.

FIG. 9 is a plan view illustrating a semiconductor package according to an example embodiment of the present disclosure.

Referring to FIG. 9, a semiconductor package 200D according to an example embodiment of the present disclosure may have a structure similar to that of the semiconductor package 200C illustrated FIGS. 8 and 9, except that there is a difference therebetween in that first to third lower semiconductor chips 220A, 220B1, and 220B2 are included, and second and third lower semiconductor chips 220B1 and 220B2 are attached to a package substrate by a single integral adhesive structure. Accordingly, the description of the semiconductor package 200C illustrated in FIGS. 8 and 9 may be combined with the description of the semiconductor package 200C according to the an example embodiment of the present disclosure, unless otherwise specified.

The chip pads 225A, 225B, and 225C of the first to third lower semiconductor chips 220A, 220B, and 220C may be respectively connected to first to third bonding pads 212A, 212B, and 212C via a bonding wire 240.

FIG. 9 illustrates a second adhesive film 252A related to the first lower semiconductor chip 220A. In a similar manner to the previous example embodiment, it may be understood that the first lower semiconductor chip 220A is disposed on and to be joined to an upper surface of the package substrate 210 using a first adhesive structure (250A in FIG. 7).

Conversely, it may be understood that the second and third lower semiconductor chips 220B and 220C are joined to the upper surface of the package substrate 210 using an integrated adhesive structure 250. Specifically, in an integrated adhesive structure, a first adhesive film may have an area corresponding to those of the second and third lower semiconductor chips 220B and 220C, and may be attached to each of lower surfaces of the second and third lower semiconductor chips 220B and 220C. As illustrated in FIG. 9, a second adhesive film 252" may be provided as a single film to cover the mounting regions of the second and third lower semiconductor chips 220B and 220C.

As described above, in the semiconductor package 200D according to the an example embodiment of the present disclosure, a second adhesive film having a large area may be disposed to an upper surface of a package substrate, such that stress concentrated in a vertical downward direction at a boundary between semiconductor chips may be dispersed through an expanded portion of the second adhesive film. In addition, an overall thickness of a adhesive structure may be increased to correspond to a thickness of the second adhesive film, thereby alleviating thermal shock.

While example embodiments have been shown and described above, it will be apparent to those skilled in the art that modifications and variations could be made without departing from the scope of the present disclosure as defined by the appended claims.

What is claimed is:

1. A semiconductor package comprising:

a package substrate, wherein a plurality of bonding pads are arranged on an upper surface of the package substrate;

a semiconductor chip mounted on the upper surface of the package substrate, wherein a plurality of chip pads are arranged on an upper surface of the semiconductor chip;

a first adhesive film attached to a lower surface of the semiconductor chip, wherein the first adhesive film has a first area when viewed in plan that is the same as an area of the lower surface of the semiconductor chip;

a second adhesive film attached to the upper surface of the package substrate, wherein the second adhesive film is in direct contact with the first adhesive film, and the second adhesive film has a second area when viewed in plan larger than the first area;

a plurality of bonding wires respectively connecting the plurality of bonding pads to the plurality of chip pads; and a molding portion disposed on the upper surface of the package substrate, the molding portion covering the semiconductor chip and the plurality of bonding wires.

2. The semiconductor package of claim 1, wherein the second area of the second adhesive film is larger than the area of the lower surface of the semiconductor chip by 20% or more.

3. The semiconductor package of claim 1, wherein the second adhesive film has portions respectively extending from edges of the semiconductor chip on the upper surface of the package substrate to be non-overlapping vertically with the first adhesive film.

4. The semiconductor package of claim 3, wherein the edges include a first pair of edges opposing each other in a first direction and a second pair of edges opposing each other in a second direction, wherein portions extending from the first pair of edges have a first width, and wherein the second pair of edges have a second width wider than the first width.

5. The semiconductor package of claim 4, wherein the plurality of bonding pads are arranged in a pair of regions respectively adjacent to the first pair of edges of the semiconductor chip, and are not arranged in a pair of regions respectively adjacent to the second pair of edges.

6. The semiconductor package of claim 1, wherein a thickness of the first adhesive film is in a range of 5 μm to 50 μm.

7. The semiconductor package of claim 1, wherein a thickness of the second adhesive film is in a range of 10 μm to 100 μm.

8. The semiconductor package of claim 7, wherein a sum of thicknesses of the first and second adhesive films is 30 μm or more.

9. The semiconductor package of claim 1, wherein a sum of thicknesses of the first and second adhesive films is 20% or more of a thickness of the semiconductor chip.

10. The semiconductor package of claim 1, wherein the second adhesive film includes a material the same as that of the first adhesive film.

11. The semiconductor package of claim 1, further comprising:

at least a second semiconductor chip stacked on the upper surface of the semiconductor chip.

12. A semiconductor package comprising:

a package substrate, wherein a plurality of bonding pads are arranged on an upper surface of the package substrate;

a first semiconductor chip mounted on the upper surface of the package substrate, wherein a plurality of first chip pads are arranged on an upper surface of the first semiconductor chip;

a second semiconductor chip mounted on the upper surface of the package substrate, wherein a plurality of second chip pads are arranged on an upper surface of the second semiconductor chip;

a first adhesive structure disposed between the package substrate and the first semiconductor chip;

a second adhesive structure disposed between the package substrate and the second semiconductor chip;

a plurality of bonding wires respectively connecting the plurality of bonding pads and the plurality of first and second chip pads; and a molding portion disposed on the upper surface of the package substrate, the molding portion covering the first and second semiconductor chips and the plurality of bonding wires, wherein the first adhesive structure includes a first adhesive film attached to a lower surface of the first semiconductor chip and a lower surface of the second semiconductor chip, and wherein the second adhesive structure includes a second adhesive film in direct contact with the first adhesive film and attached to the upper surface of the package substrate, and wherein an area of the first adhesive film when viewed in plan is larger than an area of the second adhesive film when viewed in plan.

13. The semiconductor package of claim 12, wherein the first adhesive film has areas that are the same as areas on the lower surface of the first semiconductor chip and the lower surface of the second semiconductor chip when viewed in plan, and the second adhesive film has portions respectively extending from edges of the first adhesive film on the upper surface of the package substrate to be non-overlapping vertically with the first adhesive film.

14. The semiconductor package of claim 13, wherein the edges include a first pair of edges opposing each other in a first direction and a second pair of edges opposing each other in a second direction, wherein portions extending from the first pair of edges have a first width, and wherein portions extending from the second pair of edges have a second width wider than the first width.

15. The semiconductor package of claim 12, wherein the first and second adhesive structures are implemented as a single adhesive layer.

16. The semiconductor package of claim 12, wherein a thickness of the second adhesive film is in a range of 10 to 100 μm, and a sum of thicknesses of the first and second adhesive films is 30 μm or more.

17. The semiconductor package of claim 12, wherein the second adhesive film has a thickness greater than a thickness of the first adhesive film.

18. A semiconductor package comprising:

a package substrate, wherein a plurality of bonding pads are arranged on an upper surface of the package substrate;

a semiconductor chip mounted on the upper surface of the package substrate, wherein a plurality of chip pads are arranged on an upper surface of the semiconductor chip;

a first adhesive film attached to a lower surface of the semiconductor chip, the first adhesive film having an area when viewed in plan that is the same as an area when viewed in plan of the semiconductor chip;

a second adhesive film attached to the upper surface of the package substrate, wherein the second adhesive film is disposed on and in direct contact with the first adhesive film, the second adhesive film having portions respectively extending from edges of the first adhesive film on the upper surface of the package substrate to be non-overlapping vertically with the first adhesive film;

a plurality of bonding wires respectively connecting the plurality of bonding pads and the plurality of chip pads; and a molding portion disposed on the upper surface of the package substrate, the molding portion covering the semiconductor chip and the plurality of bonding wires.

19. The semiconductor package of claim 18, wherein the edges include a first pair of edges opposing each other in a first direction and a second pair of edges opposing each other in a second direction, wherein portions extending from the first pair of edges have a first width, and wherein portions extending from the second pair of edges have a second width greater than the first width.

20. The semiconductor package of claim 19, wherein the edges include a first pair of edges opposing each other in a first direction and a second pair of edges opposing each other in a second direction, wherein the plurality of bonding pads are arranged in a pair of regions respectively adjacent to the first pair of edges of the semiconductor chip, and are not arranged in a pair of regions respectively adjacent to the second pair of edges.

* * * * *